United States Patent
Firouzdor et al.

(10) Patent No.: US 11,920,234 B2
(45) Date of Patent: Mar. 5, 2024

(54) YTTRIUM OXIDE BASED COATING COMPOSITION

(71) Applicant: APPLIED MATERIALS, INC., Santa Clara, CA (US)

(72) Inventors: Vahid Firouzdor, Hillsborough, CA (US); Christopher Laurent Beaudry, San Jose, CA (US); Hyun-Ho Doh, San Ramon, CA (US); Joseph Frederick Behnke, San Jose, CA (US); Joseph Frederick Sommers, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/089,807

(22) Filed: Dec. 28, 2022

(65) Prior Publication Data
US 2023/0160055 A1  May 25, 2023

Related U.S. Application Data

(62) Division of application No. 16/845,207, filed on Apr. 10, 2020, now Pat. No. 11,661,650.

(51) Int. Cl.
*H01L 21/67* (2006.01)
*C04B 35/111* (2006.01)
(Continued)

(52) U.S. Cl.
CPC .......... *C23C 14/083* (2013.01); *C04B 35/111* (2013.01); *C04B 35/486* (2013.01);
(Continued)

(58) Field of Classification Search
CPC ... C23C 14/081; C23C 14/083; C04B 35/111; C04B 35/505
See application file for complete search history.

(56) References Cited

U.S. PATENT DOCUMENTS

| 4,248,440 A | 2/1981 | McCormick |
| 7,300,537 B2 | 11/2007 | O'Donnell |

(Continued)

FOREIGN PATENT DOCUMENTS

| JP | 2007217779 A | 8/2007 |
| WO | 2007148931 A1 | 12/2007 |

(Continued)

OTHER PUBLICATIONS

International Search Report and Written Opinion of International Patent Application No. PCT/US2021/026266 dated Jul. 27, 2021, 11 pages.

*Primary Examiner* — Karl E Group
(74) *Attorney, Agent, or Firm* — Lowenstein Sandler LLP

(57) ABSTRACT

Described herein is a protective coating composition that provides erosion and corrosion resistance to a coated article (such as a chamber component) upon the article's exposure to harsh chemical environment (such as hydrogen based and/or halogen based environment) and/or upon the article's exposure to high energy plasma. Also described herein is a method of coating an article with the protective coating using electronic beam ion assisted deposition, physical vapor deposition, or plasma spray. Also described herein is a method of processing wafer, which method exhibits, on average, less than about 5 yttrium based particle defects per wafer.

14 Claims, 8 Drawing Sheets

500

Provide an article (e.g., chamber component)
505

Perform ion assisted deposition (e.g., e-beam IAD) to deposit a corrosion and erosion resistant protective coating on the article
510

(51) Int. Cl.

| | | |
|---|---|---|
| *C04B 35/486* | (2006.01) | |
| *C04B 35/505* | (2006.01) | |
| *C04B 35/622* | (2006.01) | |
| *C23C 4/134* | (2016.01) | |
| *C23C 14/00* | (2006.01) | |
| *C23C 14/08* | (2006.01) | |
| *C23C 14/22* | (2006.01) | |
| *H01J 37/32* | (2006.01) | |

(52) U.S. Cl.
CPC ...... *C04B 35/505* (2013.01); *C04B 35/62222* (2013.01); *C23C 4/134* (2016.01); *C23C 14/0052* (2013.01); *C23C 14/081* (2013.01); *C23C 14/221* (2013.01); *H01J 37/32495* (2013.01); *H01L 21/67213* (2013.01)

(56) References Cited

U.S. PATENT DOCUMENTS

| | | |
|---|---|---|
| 7,683,450 B2 | 3/2010 | Hart |
| 9,581,742 B2 | 2/2017 | Gafsi |
| 9,583,369 B2 | 2/2017 | Sun |
| 9,725,799 B2 | 8/2017 | Sun |
| 9,765,440 B2 | 9/2017 | Curran |
| 9,869,012 B2 | 1/2018 | Sun |
| 9,970,095 B2 | 5/2018 | Sun et al. |
| 10,020,218 B2 | 7/2018 | Boyd, Jr. |
| 2001/0003271 A1 | 6/2001 | Otsuki |
| 2008/0110760 A1 | 5/2008 | Han |
| 2009/0097105 A1 | 4/2009 | Hart |
| 2014/0139910 A1 | 5/2014 | Gafsi |
| 2014/0154465 A1 | 6/2014 | Sun |
| 2014/0263272 A1 | 9/2014 | Duan |
| 2014/0377504 A1 | 12/2014 | Sun |
| 2015/0021324 A1 | 1/2015 | Sun |
| 2015/0143677 A1 | 5/2015 | Sun |
| 2015/0158775 A1 | 6/2015 | Sun |
| 2017/0140970 A1 | 5/2017 | Boyd, Jr. |
| 2018/0100228 A1 | 4/2018 | Sun |
| 2018/0105922 A1 | 4/2018 | Sun |
| 2018/0374706 A1 | 12/2018 | Pareek |
| 2019/0210927 A1 | 7/2019 | Yang |
| 2019/0271076 A1 | 9/2019 | Fenwick |
| 2020/0024194 A1 | 1/2020 | Wu |

FOREIGN PATENT DOCUMENTS

| | | |
|---|---|---|
| WO | 2015199752 A1 | 12/2015 |
| WO | 2021102075 A1 | 5/2021 |

500

Provide an article (e.g., chamber component)
505

Perform ion assisted deposition (e.g., e-beam IAD) to deposit a corrosion and erosion resistant protective coating on the article
510

Transfer a wafer into a processing chamber including at least one chamber component coated with a protective coating
615

Process the wafer in the processing chamber, e.g. under harsh chemical environment and/or high energy plasma environment
620

Transfer processed wafer out of processing chamber
625

FIG. 6

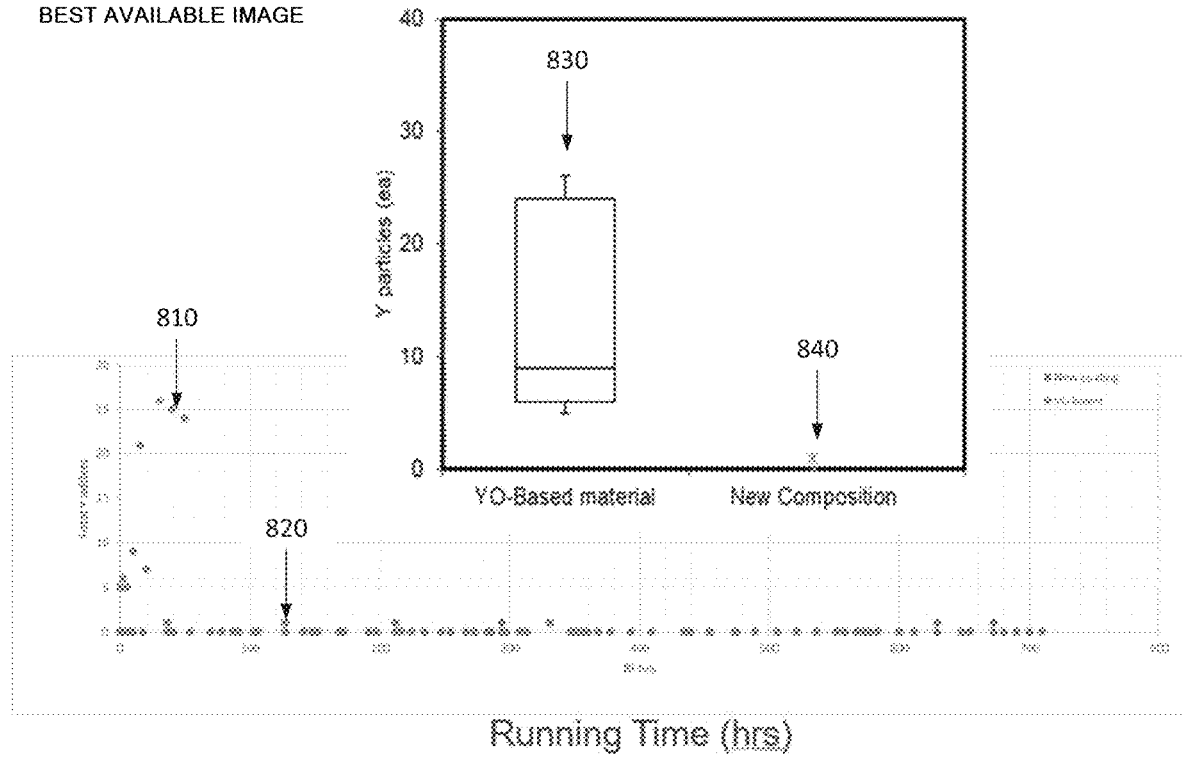

YTTRIUM OXIDE BASED COATING COMPOSITION

CROSS REFERENCE TO RELATED APPLICATION(S)

This application is a divisional application of U.S. patent application Ser. No. 16/845,207, filed on Apr. 10, 2020, which is incorporated herein by reference in its entirety.

TECHNICAL FIELD

Embodiments of the present invention relate, in general, to a method of coating chamber components with a yttrium oxide based protective coating composition using ion assisted deposition, plasma spray, or physical vapor deposition.

BACKGROUND

In the semiconductor industry, devices are fabricated by a number of manufacturing processes producing structures of an ever-decreasing size. As device geometries shrink, controlling the process uniformity and repeatability become much more challenging.

Existing manufacturing processes expose semiconductor processing chamber components to high energy aggressive plasma and/or corrosive environment which may be harmful to the integrity of the semiconductor processing chamber components and may further contribute to the challenge of controlling process uniformity and repeatability.

Hence, certain semiconductor processing chamber components (e.g., liners, doors, lids, and so on) are coated with yttrium based protective coatings. Yttria ($Y_2O_3$) is commonly used in etch chamber components due to its good erosion and/or sputtering resistance in aggressive plasma environment.

It would be advantageous to arrive at a protective coating that provides both physical resistance to sputtering occurring from high energy aggressive plasma and chemical resistance to corrosion occurring from corrosive environments.

BRIEF SUMMARY OF EMBODIMENTS

In certain embodiments, the instant disclosure is directed to a coated chamber component. The coated chamber component includes a body and a corrosion and erosion resistant coating. The corrosion and erosion resistant coating includes a single phase blend of yttrium oxide at a molar concentration ranging from about 0.1 mole % up to 37 mole % and aluminum oxide at a molar concentration ranging from above 63 mole % to about 99.9 mole %.

In certain embodiments, the instant disclosure is directed to a method for coating a chamber component. The method includes performing electron beam ion assisted deposition (e-beam IAD), physical vapor deposition (PVD), or plasma spray to deposit a corrosion and erosion resistant coating. The corrosion and erosion resistant coating includes a single phase blend of yttrium oxide at a molar concentration ranging from about 0.1 mole % up to 37 mole % and aluminum oxide at a molar concentration ranging from above 63 mole % to about 99.9 mole %.

In certain embodiments, the instant disclosure is directed to a method for processing a wafer. The method includes processing a wafer in a chamber that includes at least one chamber component coated with a corrosion and erosion resistant coating. The corrosion and erosion resistant coating includes a single phase blend of yttrium oxide at a molar concentration ranging from about 0.1 mole % up to 37 mole % and aluminum oxide at a molar concentration ranging from above 63 mole % to about 99.9 mole %.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 5 illustrates a method for coating an article with a protective coating according to an embodiment.

FIG. 6 illustrates a method for processing a wafer in a processing chamber that includes at least one chamber component coated with a protective coating according to an embodiment.

FIG. 8 shows total yttrium-based particles during a 700 RFhrs chamber marathon running aggressive chemistry using a protective coating according to an embodiment as compared to a comparative YO coating.

FIG. 9 shows the total yttrium-based defects per wafer of a protective coating according to an embodiment as compared to a comparative YO coating.

DETAILED DESCRIPTION OF EMBODIMENTS

Figure 1:
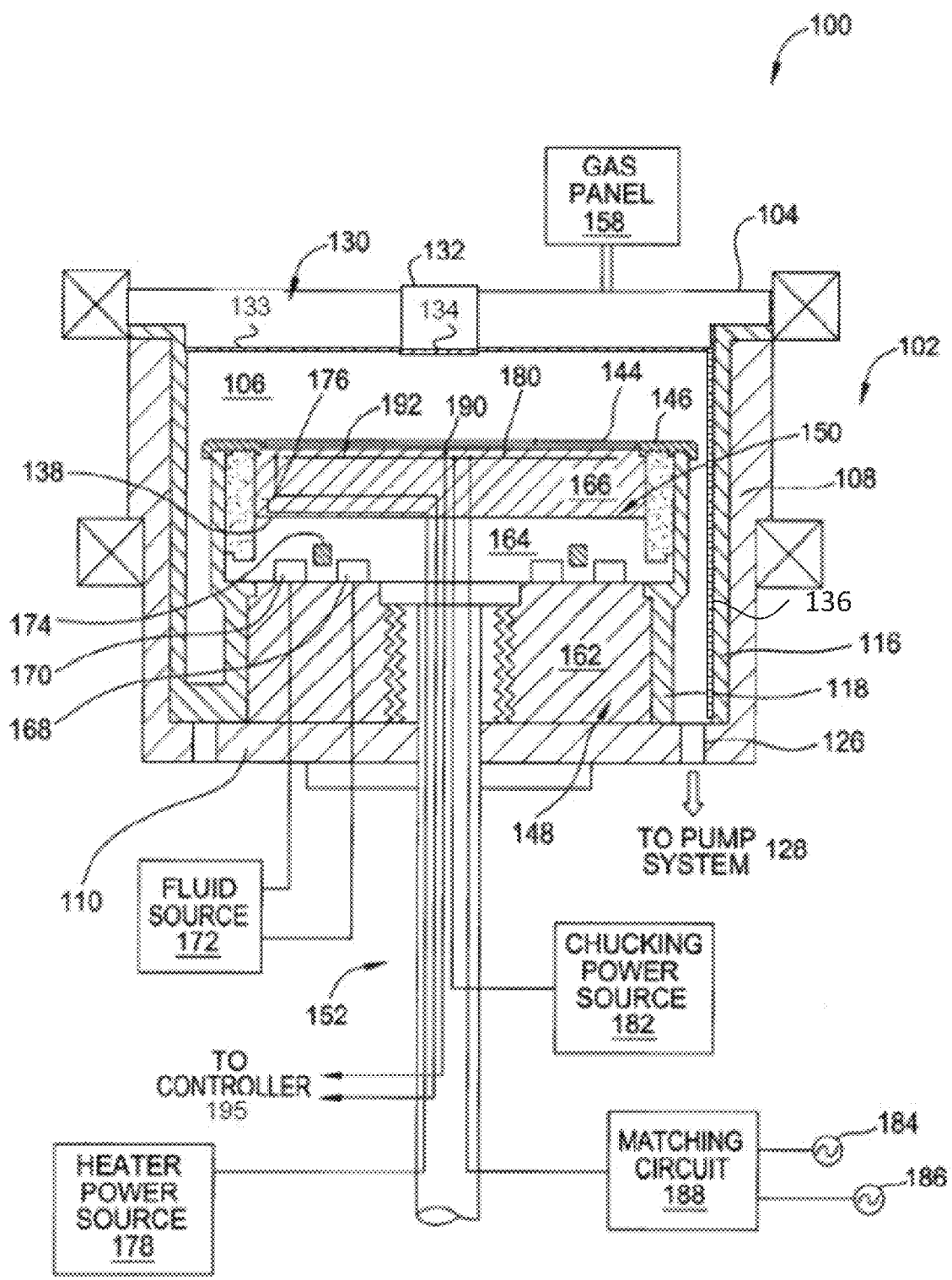
FIG. 1 depicts a sectional view of one embodiment of a processing chamber.

Semiconductor manufacturing processes expose semiconductor process chamber components to high energy aggressive plasma environments and to corrosive environments. To protect the process chamber components from these aggressive environments, chamber components are coated with protective coatings.

Yttria ($Y_2O_3$) is commonly used in coatings of chamber components (e.g., etch chamber components) for its good erosion resistance. Despite its good erosion resistance, yttria is not chemically stable in aggressive etch chemistries. Radicals like Fluorine, Chlorine and Bromide easily attack yttria chemically, contributing to the formation of yttrium-based particles. yttrium-based particles contribute to defects in etch applications. Hence, various industries (e.g., logic industry) have begun to set tight specifications for yttrium-based defects on product wafers.

To meet these tight specifications, it is beneficial to identify protective coating compositions that provide both physical resistance to sputtering occurring due to high energy aggressive plasma and chemical resistance occurring due to chemical attacks by aggressive chemical environments.

In this disclosure a protective coating has been identified having improved chemical stability compared to pure yttria ($Y_2O_3$) and other yttrium-based materials while also maintaining physical resistance to high energy aggressive plasma compared to pure alumina ($Al_2O_3$).

In certain embodiments, the protective coating described herein is a corrosion and erosion resistant coating that includes a single phase blend of aluminum oxide and yttrium oxide. In certain embodiments, the protective coating is amorphous. Due to the amorphous nature of the protective coating, it may include more alumina than could otherwise be included in a coating that is in a crystalline phase. A crystalline coating of yttria and alumina is constrained to the phases depicted in the alumina-yttria phase diagram, such as the one shown in FIG. 7. For instance, according to region A in the phase diagram of FIG. 7, spanning from a yttria mole fraction greater than 0 but less than about 0.37 (the yttria mole fraction associated with the first vertical line B in the phase diagram which is representative of the crystalline phase yttrium aluminum garnet (YAG)), at a temperature below about 2080 K, a crystalline yttria-alumina coating with two phases would form, namely—a crystalline YAG phase and a crystalline alumina phase. Coatings described herein deviate from the conventional phase diagram by forming a single phase (e.g., amorphous phase) of alumina and yttria blend with a composition of alumina and yttria that would otherwise fall in the A region.

Without being construed as limiting, it is believed that due to the amorphous nature of certain coatings described herein, it is possible to introduce more of the aluminum-based component into the coating and render the coating more chemically resistant to harsh chemical environments (e.g., acidic environments, hydrogen based environments, and halogen based environments) while still maintaining a sufficient amount of the yttrium-based component in the coating to render it physically resistant to high energy plasma environments.

In certain embodiments, the instant disclosure is directed to a method for coating a chamber component with any of the protective coatings described herein. Any chamber component that is exposed to the harsh chemical environments and/or to the high energy plasma environments in a processing chamber may be coated with the protective coatings described herein. The chamber components may be coated on the processing environment facing side and optionally on other sides. Suitable chamber components that could benefit from such coatings include, without limitation, lids, liners, doors, nozzles, and so on. The protective coating may be formed on the processing environment (e.g., plasma environment and/or chemical environment) facing side of the body of the chamber component using ion assisted deposition (IAD) (e.g., using electron beam IAD (EB-IAD)). In certain embodiments, the protective coating may be formed using plasma spray deposition or physical vapor deposition.

The improved corrosion and/or erosion resistance provided by the protective coating may improve the service life of the coated article, while reducing maintenance and manufacturing cost. Additionally, the coating described herein (whether deposited via IAD, PVD, or plasma spray) can be applied thick enough to provide a longer life time for the component as compared to other yttrium based coatings (deposited by a similar deposition technique) or as compared to an uncoated component.

In certain embodiments, the instant disclosure is further directed to a method for processing a wafer in a processing chamber that includes at least one chamber component coated with the protective coatings described herein. Due to the improved corrosion and/or erosion resistance provided by the protective coating, the coated chamber components produce less yttrium based particles, which have become a major contributor to wafer defects. Tight specifications are set around yttrium-based particles and corresponding yttrium-based defects with the ultimate goal of eliminating yttrium-based defects in wafers altogether. Wafers processed in processing chambers with at least one chamber component coated with the protective coatings described herein exhibit, on average, less than about 1 yttrium-based particle defect per wafer. In comparison, wafers processed in processing chambers where the chamber components are coated with comparative protective coatings exhibit, on average, more than about 8 yttrium-based particle defects per wafer.

FIG. 1 is a sectional view of a semiconductor processing chamber 100 having one or more chamber components that are coated with a protective coating in accordance with embodiments of the present disclosure. The processing chamber 100 may be used for processes in which aggressive plasma environment and/or aggressive chemical environment is provided. For example, the processing chamber 100 may be a chamber for a plasma etch reactor (also known as a plasma etcher), a plasma cleaner, and so forth. Examples of chamber components that may include a protective coating include a substrate support assembly 148, an electrostatic chuck (ESC) 150, a ring (e.g., a process kit ring or single ring), a chamber wall, a base, a gas distribution plate, a showerhead, a liner, a liner kit, a shield, a plasma screen, a flow equalizer, a cooling base, a chamber viewport, a chamber lid 130, a nozzle, and so on. In one particular embodiment, the protective coating is applied over a chamber lid 130 and/or a liner 116.

In certain embodiments, the protective coating, which is described in greater detail below, is a single phase amorphous coating that is a blend of yttrium oxide at a molar concentration of about 0.1 mole % to up to 37 mole % and aluminum oxide at a molar concentration of above 63 mole % to about 99.9 mole % deposited by electron beam ion assisted deposition (e-beam IAD). Alternatively, other forms of IAD may be used to deposit the coating. Alternatively, other deposition techniques such as physical vapor deposition (PVD) or plasma spray may be used to deposit the coating.

In certain embodiments, the protective coating includes yttrium oxide at a molar concentration of about 10 mole % to up to 37 mole % and aluminum oxide at a molar concentration of above 63 mole % to about 90 mole %. In certain embodiments, the protective coating includes yttrium oxide at a molar concentration of about 15 mole % to up to 37 mole % and aluminum oxide at a molar concentration of above 63 mole % to about 85 mole %. In certain embodiments, the protective coating includes yttrium oxide at a molar concentration of about 5 mole % to about 35 mole % and aluminum oxide at a molar concentration of about 65 mole % to about 95 mole %. In certain embodiments, the protective coating includes yttrium oxide at a molar concentration of about 5 mole % to about 30 mole % and aluminum oxide at a molar concentration of about 70 mole % to about 95 mole %. In certain embodiments, the protective coating includes yttrium oxide at a molar concentration of about 5 mole % to about 20 mole % and aluminum oxide at a molar concentration of about 80 mole % to about 95 mole %. In certain embodiments, the molar concentration of yttrium oxide and aluminum oxide in the protective coating adds up to 100 mole %.

In certain embodiments, the protective coating includes yttrium oxide at a molar concentration ranging from any of about 0.1 mole %, about 0.5 mole %, about 1.0 mole %, about 2 mole %, about 3 mole %, about 4 mole %, about 5 mole %, about 6 mole %, about 7 mole %, about 8 mole %, about 9 mole %, about 10 mole %, about 11 mole %, about 12 mole %, about 13 mole %, about 14 mole %, about 15 moles %, about 16 mole %, about 17 mole %, about 18 mole %, about 19 mole %, or about 20 mole % to any of about 21 mole %, about 22 mole %, about 23 mole %, about 24 mole %, about 25 mole %, about 26 mole %, about 27 mole %, about 28 mole %, about 29 mole %, about 30 mole %, about 31 mole %, about 32 mole %, about 33 mole %, about 34 mole %, about 35 mole %, about 36 mole %, or up to 37 mole %, any single value therein or any sub-range therein.

In certain embodiments, the protective coating includes aluminum oxide at a molar concentration ranging from any of above 63 mole %, about 64 mole %, about 65 mole %, about 66 mole %, about 67 mole %, about 68 mole %, about 69 mole %, about 70 mole %, about 71 mole %, about 72 mole %, about 73 mole %, about 74 mole %, about 75 mole %, about 76 mole %, about 77 mole %, about 78 mole %, about 79 mole %, or about 80 mole % to any of about 81 mole %, about 82 mole %, about 83 mole %, about 84 mole %, about 85 mole %, about 86 mole %, about 87 mole %, about 88 mole %, about 89 mole %, about 90 mole %, about 91 mole %, about 92 mole %, about 93 mole %, about 94 mole %, about 95 mole %, about 96 mole %, about 97 mole %, about 98 mole %, about 99 mole %, about 99.5 mole %, or about 99.9 mole %, or any single value therein or any sub-range therein.

In certain embodiments, the protective coating described herein consists of or consists essentially of a single phase amorphous blend of aluminum oxide and yttrium oxide, wherein the aluminum oxide is present in the protective coating at a molar concentration ranging from above 63 mole % to about 99.9 mole %, from above 63 mole % to about 90 mole %, from above 63 mole % to about 85 mole %, from about 65 mole % to about 95 mole %, from about 70 mole % to about 95 mole %, or from about 80 mole % to about 95 mole % and the yttrium oxide is present in the protective coating at a molar ranging from about 0.1 mole % to up to 37 mole %, from about 10 mole % to up to 37 mole %, from about 15 mole % to up to 37 mole %, from about 5 mole % to about 35 mole %, from about 5 mole % to about 30 mole %, or from about 5 mole % to about 20 mole %.

Figure 7:
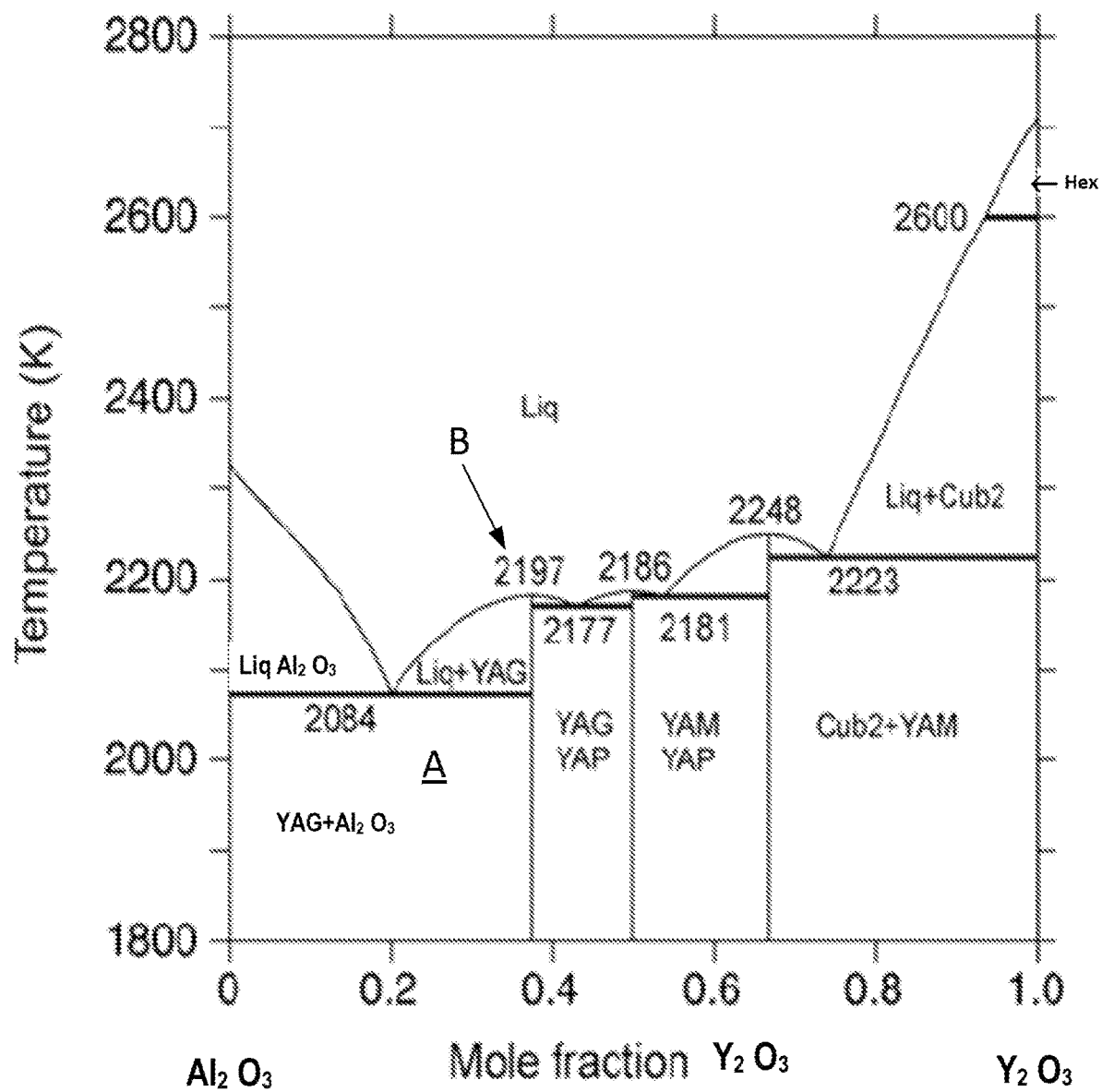
FIG. 7 illustrates a phase diagram of alumina and yttria.

The protective coatings described herein provide the flexibility of incorporating a greater amount of aluminum oxide, which provides for a greater chemical stability to harsh chemical environments (such as acidic environment, hydrogen based environments, and halogen based environments) as compared to other yttrium based coatings or yttrium and aluminum based coatings that are constrained to the alumina-yttria phase diagram depicted in FIG. 7. It is possible to incorporate more alumina into protective coatings described herein due to their amorphous nature in which bond links can and do vary (as compared to bond links in phases that are constrained to the alumina-yttria phase diagram of FIG. 7).

FIG. 7 depicts a phase diagram of yttria and alumina at various temperatures. In region A, ranging from above 0 mole % yttria to below 37 mole % yttria and from above 63 mole % alumina to below 100 mole % alumina, at a temperature below about 2080 K (e.g., below 2084 K), the phase diagram exhibits a two phase system crystalline alumina and crystalline YAG (yttrium aluminum garnet). In the midway of region A, at a temperature below about 2080 K (e.g., below 2084 K), the two phases, YAG and alumina, are present at approximately equal amounts (i.e., about 1:1 mole alumina to mole YAG). To the left of the midway of region A (i.e., closer to pure alumina), at a temperature below about 2080 K (e.g., below 2084 K), crystalline alumina is the majority phase and crystalline YAG is the minority phase. To the right of the midway of region A, at a temperature below about 2080 K (e.g., below 2084 K), crystalline YAG is the majority phase and crystalline alumina is the minority phase. At the first vertical line, designated as B (corresponding to the temperature of 2197 K), in the phase diagram, at about 37 mole % yttria and about 63 mole % alumina, crystalline YAG forms. It is believed, without being construed as limiting, that starting from any point in the phase diagram, on the crystalline YAG line or in the dual phase region of crystalline alumina and crystalline YAG, at a temperature below 2084 K, and attempting to add more alumina to the composition, would provide a two distinct phase system of crystalline alumina and crystalline YAG (e.g., alumina particles may be dispersed in a YAG matrix). However, such composition would provide less chemical resistance than the amorphous coating described herein.

In certain embodiments, the protective coatings described herein have a coating composition that includes aluminum at a concentration ranging from any of about 20 atom %, about 21 atom %, about 22 atom %, about 23 atom %, about 24 atom %, about 25 atom %, about 26 atom %, about 27 atom %, about 28 atom %, about 29 atom %, or about 30 atom % to any of about 31 atom %, about 32 atom %, about 33 atom %, about 34 atom %, about 35 atom %, about 36 atom %, about 37 atom %, about 38 atom %, about 39 atom %, about 40 atom %, about 41 atom %, about 42 atom %, about 43 atom %, about 44 atom %, or about 45 atom %, or any single value therein or any sub-range therein. In one embodiment, the aluminum concentration in the protective coating ranges from about 20 atom % to about 35 atom %. In one embodiment, the aluminum concentration in the protective coating ranges from about 27 atom % to about 44 atom %.

In certain embodiments, the protective coatings described herein have a coating composition that includes yttrium at a concentration ranging from any of about 1 atom %, about 2 atom %, about 3 atom %, about 4 atom %, about 5 atom %, about 6 atom %, about 7 atom %, about 8 atom %, about 9 atom %, or about 10 atom % to any of about 11 atom %, about 12 atom %, about 13 atom %, about 14 atom %, about 15 atom %, about 16 atom %, about 17 atom %, about 18 atom %, about 19 atom %, or about 20 atom %, or any single value therein or any sub-range therein. In one embodiment, the yttrium concentration in the protective coating ranges from about 1 atom % to about 8 atom %. In one embodiment, the yttrium concentration in the protective coating ranges from about 8 atom % to about 18 atom %.

In certain embodiments, the protective coatings described herein have a coating composition that includes oxygen at a concentration ranging from any of about 55 atom %, about 56 atom %, about 57 atom %, about 58 atom %, about 59 atom %, about 60 atom %, about 61 atom %, about 62 atom %, or about 63 atom % to any of about 64 atom %, about 65 atom %, about 66 atom %, about 67 atom %, about 68 atom %, about 69 atom %, or about 70 atom %, or any single value therein or any sub-range therein. In one embodiment, the oxygen concentration in the protective coating ranges from about 55 atom % to about 70 atom %. In one embodiment, the oxygen concentration in the protective coating ranges from about 62 atom % to about 70 atom %.

In one embodiment, the protective coating comprises, consists, or consists essentially of about 27 atom % to about 44 atom % aluminum, about 1 atom % to about 8 atom % yttrium, and about 55 atom % to about 70 atom % oxygen. In one embodiment, the protective coating comprises, consists, or consists essentially of about 20 atom % to about 35 atom % aluminum, about 8 atom % to about 18 atom % yttrium, and about 62 atom % to about 70 atom % oxygen.

The ratio of aluminum atom % to yttrium atom % in the protective coating described herein may range from any of about 1, about 1.5, about 2, about 2.5, about 3, about 3.5, about 4, about 4.5, about 5, about 6, about 7, about 8, about 9, or about 10 to any of about 12, about 14, about 16, about 18, about 20, about 22, about 24, about 26, about 28, about 30, about 34, about 38, about 42, or about 44. In one embodiment, the ratio of aluminum atom % to yttrium atom % in the protective coating ranges from about 1 to about 4.5. In one embodiment, the ratio of aluminum atom % to yttrium atom % ranges from about 3.4 to about 44.

The protective coating composition is determined by Scanning Electron Microscope Energy Dispersive Spectroscopy (SEM-EDS) analysis with a magnification of 1000x and accelerating voltage of 10 keV.

In certain embodiments, the coating described herein provides a greater chemical resistance as compared to YAG or as compared to multi-phase compositions including YAG in combination with other material (such as alumina). In certain embodiments, the coating described herein includes a single phase amorphous blend of yttria and alumina, which includes a greater concentration of alumina/aluminum as compared to the amount of alumina/aluminum in YAG.

In certain embodiments, the protective coating described herein has no crystalline areas therein. In certain embodiments, the protective coating has no free alumina, no free yttria, and/or no YAG therein. In certain embodiments, the protective coating is more than about 90% amorphous, more than about 92% amorphous, more than about 94% amorphous, more than about 96% amorphous, more than about 98% amorphous, or more than about 99% amorphous as measured by X-Ray Diffraction (XRD).

The protective coating may be an e-beam IAD deposited coating, a PVD deposited coating, or a plasma spray deposited coating applied over different ceramics including oxide based ceramics, nitride based ceramics and/or carbide based ceramics. Examples of oxide based ceramics include $SiO_2$ (quartz), $Al_2O_3$, $Y_2O_3$, and so on. Examples of carbide based ceramics include SiC, Si—SiC, and so on. Examples of nitride based ceramics include AN, SiN, and so on. E-beam IAD coating plug material can be calcined powders, preformed lumps (e.g., formed by green body pressing, hot pressing, and so on), a sintered body (e.g., having 50-100% density), or a machined body (e.g., can be ceramic, metal, or a metal alloy). Returning to FIG. 1, as illustrated, the lid 130, nozzle 132, and liner 116 each have a protective coating 133, 134, and 136, respectively, in accordance with one embodiment. However, it should be understood that any of the other chamber components, such as those listed above, may also include a protective coating.

In one embodiment, the processing chamber 100 includes a chamber body 102 and a lid 130 that enclose an interior volume 106. The chamber body 102 may be fabricated from aluminum, stainless steel or other suitable material. The chamber body 102 generally includes sidewalls 108 and a bottom 110. Any of the lid 130, sidewalls 108 and/or bottom 110 may include a protective coating.

An outer liner 116 may be disposed adjacent the sidewalls 108 to protect the chamber body 102. The outer liner 116 may be fabricated and/or coated with a protective coating. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 130 may be supported on the sidewall 108 of the chamber body 102. The lid 130 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the nozzle 132. The lid 130 may be a ceramic such as $Al_2O_3$, $Y_2O_3$, YAG, $SiO_2$, AlN, SiN, SiC, Si—SiC, or a ceramic compound comprising $Y_4Al_2O_9$ and a solid-solution of $Y_2O_3$—$ZrO_2$. The nozzle 132 may also be a ceramic, such as any of those ceramics mentioned for the lid. The lid 130 and/or nozzle 132 may be coated with a protective coating 133, 134, respectively.

Examples of processing gases that may be used to process substrates in the processing chamber 100 include halogen-containing gases and hydrogen-containing gases, such as $C_2F_6$, $SF_6$, $SiCl_4$, HBr, $NF_3$, $CF_4$, $CRF_3$, $CH_2F_3$, F, $NF_3$, $Cl_2$, $CCl_4$, $BCl_3$, $SiF_4$, $H_2$, $Cl_2$, HCl, HE, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the lid 130. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may be coated with a protective coating.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, that may be formed in an upper surface of the puck 166. The gas passages may be fluidly coupled to a source of a heat transfer (or backside) gas such as He via holes drilled in the puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2A:
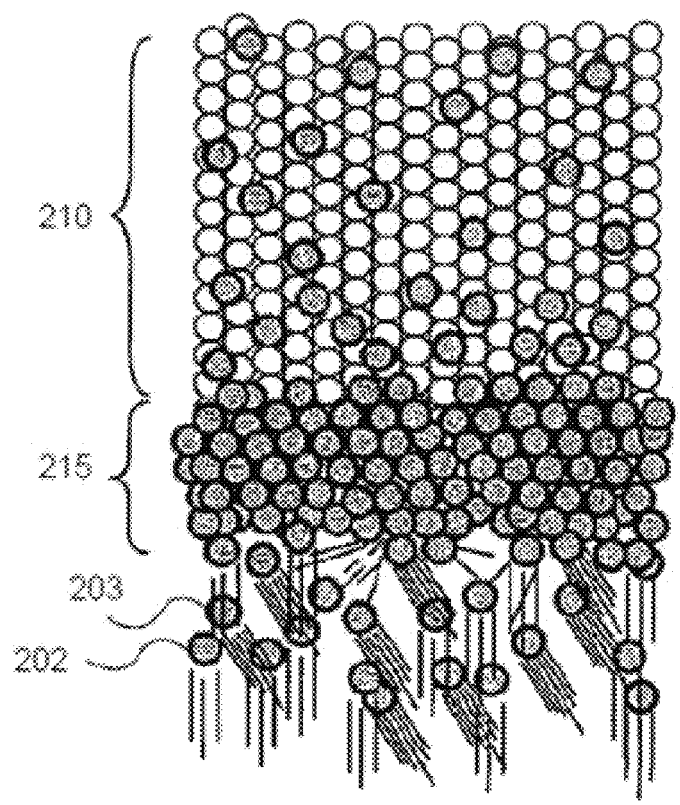
FIG. 2A depicts a deposition mechanism applicable to a variety of deposition techniques utilizing energetic particles such as ion assisted deposition (IAD).

FIG. 2A depicts a deposition mechanism applicable to a variety of deposition techniques utilizing energetic particles such as ion assisted deposition (IAD). Exemplary IAD methods include deposition processes which incorporate ion bombardment, such as evaporation (e.g., activated reactive evaporation (ARE)) and sputtering in the presence of ion bombardment to form protective coatings as described herein. One particular type of IAD performed in embodiments is electron beam IAD (e-beam IAD). Any of the IAD methods may be performed in the presence of a reactive gas species, such as $O_2$, $N_2$, halogens (e.g., fluorine), Argon etc. Such reactive species may burn off surface organic contaminants prior to and/or during deposition. Additionally, the IAD deposition process for ceramic target deposition vs. the metal target deposition can be controlled by partial pressure of 02 ions in embodiments. Alternatively, a ceramic target can be used with no oxygen or reduced oxygen. In certain embodiments, the IAD deposition is performed in the presence of oxygen and/or argon. In certain embodiments, the IAD deposition is performed in the presence of fluorine so as to deposit the coating with fluorine incorporated into the coating. Coatings with fluorine incorporated therein are believed to be less likely to interact with wafer processes that include similar environments (e.g., processing with a fluorine environment).

As shown, the protective coating 215 (similar to coating 133, 134, and 136 in FIG. 1) is formed on an article 210 or on multiple articles 210A, 210B (such as any of the chamber components described before) by an accumulation of deposition materials 202 in the presence of energetic particles 203 such as ions. The deposition materials 202 may include atoms, ions, radicals, and so on. The energetic particles 203 may impinge and compact the protective coating 215 as it is formed.

Figure 2B:
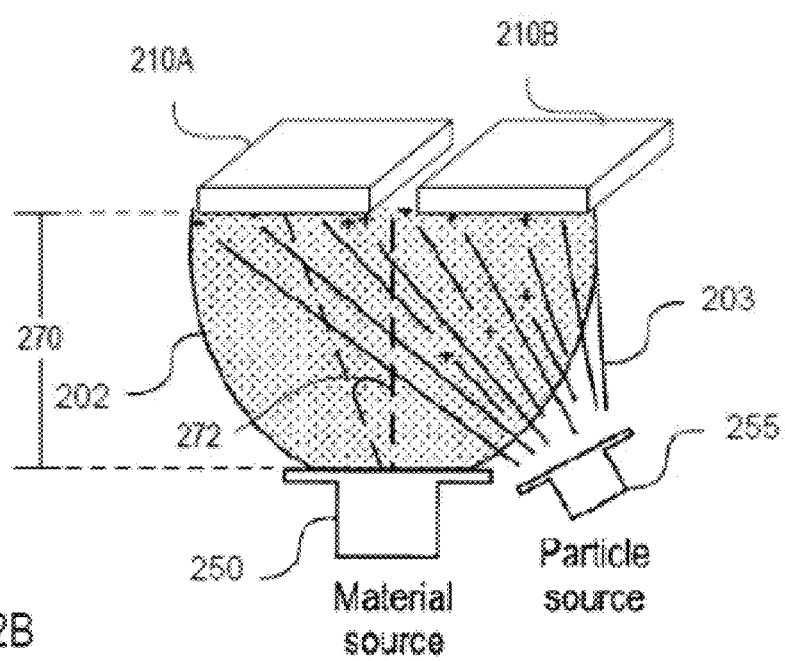
FIG. 2B depicts a schematic of an IAD deposition apparatus.

In one embodiment, EB-IAD is utilized to form the protective coating 215. FIG. 2B depicts a schematic of an IAD deposition apparatus. As shown, a material source 250 provides a flux of deposition materials 202 while an energetic particle source 255 provides a flux of the energetic particles 203, both of which impinge upon the article 210, 210A, 210B throughout the IAD process. The energetic particle source 255 may be oxygen or other ion source. The energetic particle source 255 may also provide other types of energetic particles such as radicals, neutrons, atoms, and nano-sized particles which come from particle generation sources (e.g., from plasma, reactive gases or from the material source that provide the deposition materials).

The material source (e.g., a target body or a plug material) 250 used to provide the deposition materials 202 may be a bulk sintered ceramic corresponding to the same ceramic that the protective coating 215 is to be composed of (e.g., a bulk sintered ceramic consisting of a single phase of amorphous $Y_2O_3$—$Al_2O_3$). The material source may be a bulk sintered ceramic compound body, such as bulk sintered YAG and bulk sintered $Al_2O_3$, and/or other mentioned ceramics. Other target materials may also be used, such as powders, calcined powders, preformed material (e.g., formed by green body pressing or hot pressing), or a machined body (e.g., fused material). All of the different types of material sources 250 are melted into molten material sources during deposition. However, different types of starting material take different amounts of time to melt. Fused materials and/or machined bodies may melt the quickest. Preformed material melts slower than fused materials, calcined powders melt slower than preformed materials, and standard powders melt more slowly than calcined powders.

In some embodiments, the material source is a metallic material (e.g., a mixture of Y and Al, or two different targets, one of Y and one of Al). Such a material source may be bombarded by oxygen ions to form an oxide coating. Additionally, or alternatively, an oxygen gas may be flowed into a deposition chamber during the IAD process to cause the sputtered or evaporated metals of Y and Al to interact with oxygen and form an oxide coating.

IAD may utilize one or more plasmas or beams (e.g., electron beams) to provide the material and energetic ion sources. Reactive species may also be provided during deposition of the plasma resistant coating. In one embodiment, the energetic particles 203 include at least one of non-reactive species (e.g., Ar) or reactive species (e.g., O). In further embodiments, reactive species such as CO and halogens (Cl, F, Br, etc.) may also be introduced during the formation of a protective coating to further increase the tendency to selectively remove deposited material most weakly bonded to the protective coating 215.

With IAD processes, the energetic particles 203 may be controlled by the energetic ion (or other particle) source 255 independently of other deposition parameters. According to the energy (e.g., velocity), density and incident angle of the energetic ion flux, composition, structure, crystalline orientation, grain size, and amorphous nature of the protective coating may be manipulated.

Additional parameters that may be adjusted are a temperature of the article during deposition as well as the duration of the deposition. In one embodiment, an IAD deposition chamber (and the chamber lid) is heated to a starting temperature of 70° C. or higher prior to deposition.

In one embodiment, the starting temperature is 50° C. to 250° C. In one embodiment, the starting temperature is 50° C. to 100° C. The temperature of the chamber and of the lid may then be maintained at the starting temperature during deposition. In one embodiment, the IAD chamber includes heat lamps which perform the heating. In an alternative embodiment, the IAD chamber and lid are not heated. If the chamber is not heated, it will naturally increase in temperature to about 70° C. as a result of the IAD process. A higher temperature during deposition may increase a density of the protective coating but may also increase a mechanical stress of the protective coating. Active cooling can be added to the chamber to maintain a low temperature during coating. The low temperature may be maintained at any temperature at or below 70° C. down to 0° C. in one embodiment.

Additional parameters that may be adjusted are working distance 270 and angle of incidence 272. The working distance 270 is the distance between the material source 250 and the article 210A, 210B. In one embodiment, the working distance is 0.2 to 2.0 meters, with a working distance of 1.0 meters in one particular embodiment. Decreasing the working distance increases a deposition rate and increases an effectiveness of the ion energy. However, decreasing the working distance below a particular point may reduce a uniformity of the protective layer. The angle of incidence is an angle at which the deposition materials 202 strike the articles 210A, 210B. In one embodiment the angle of incidence is 10-90 degrees.

IAD coatings can be applied over a wide range of surface conditions with roughness from about 0.1 micro-inches (μin) to about 180 μm. However, smoother surface facilitates uniform coating coverage. The coating thickness can be up to about 300 microns (μm). In production, coating thickness on components can be assessed by purposely adding a rare earth oxide based colored agent such $Nd_2O_3$, $Sm_2O_3$, $Er_2O_3$, etc. at the bottom of a coating layer stack. The thickness can also be accurately measured using ellipsometry.

IAD coatings can be amorphous or crystalline depending on the rare-earth oxide composite used to create the coating and/or the deposition conditions. Amorphous coatings are more conformal and reduce lattice mismatch induced epitaxial cracks whereas crystalline coatings are more erosion resistant. In one embodiments, the protective coating described herein is amorphous and has zero crystallinity. In certain embodiments, the protective coating described herein is conformal and has a low film stress.

Co-deposition of multiple targets using multiple electron beam (e-beam) guns can be achieved to create thicker coatings as well as layered architectures. For example, two targets having the same material type may be used at the same time. Each target may be bombarded by a different electron beam gun. This may increase a deposition rate and a thickness of the protective layer. In another example, two targets may be different ceramic materials. For example, one target of Al or $Al_2O_3$ and another target of Y or $Y_2O_3$ may be used. A first electron beam gun may bombard a first target to deposit a first protective layer, and a second electron beam gun may subsequently bombard the second target to form a second protective layer having a different material composition than the first protective layer.

In an embodiment, a single target material (also referred to as plug material) and a single electron beam gun may be used to arrive at the protective coating described herein.

In one embodiment, multiple chamber components (e.g., multiple lids or multiple liners) are processed in parallel in an IAD chamber. Each chamber component may be supported by a different fixture. Alternatively, a single fixture may be configured to hold multiple chamber components. The fixtures may move the supported chamber components during deposition.

In one embodiment, a fixture to hold a chamber component can be designed out of metal components such as cold rolled steel or ceramics such as $Al_2O_3$, $Y_2O_3$, etc. The fixture may be used to support the chamber component above or below the material source and electron beam gun. The fixture can have a chucking ability to chuck the chamber component for safer and easier handling as well as during coating. Also, the fixture can have a feature to orient or align the chamber component. In one embodiment, the fixture can be repositioned and/or rotated about one or more axes to change an orientation of the supported chamber component to the source material. The fixture may also be repositioned to change a working distance and/or angle of incidence before and/or during deposition. The fixture can have cooling or heating channels to control the chamber component's temperature during coating. The ability or reposition and rotate the chamber component may enable maximum coating coverage of 3D surfaces such as holes since IAD is a line of sight process.

Figure 3:
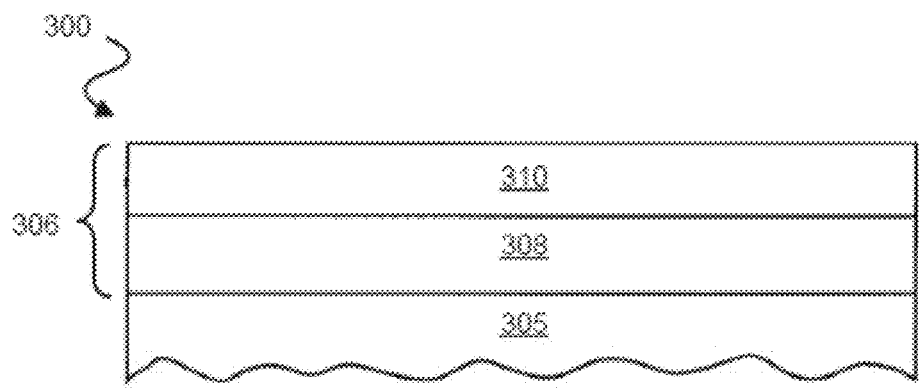
FIG. 3 illustrates cross sectional side views of articles (e.g., lids) covered by one or more protective coatings.

FIG. 3 illustrates a cross sectional side view of an article that may be covered by one or more protective coatings (e.g., chamber components such as lids and/or doors and/or liners and/or nozzles).

Referring to FIG. 3, a body 305 of the chamber component 300 includes a coating stack 306 having a first protective coating 308 and a second protective coating 310. Alternatively, the article 300 may include only a single protective coating 308 on the body 305. In one embodiment, the protective coatings 308, 310 have a thickness of up to about 300 μm. In a further embodiment, the protective coatings have a thickness of below about 20 microns, such as a thickness between about 0.5 microns to about 12 microns, a thickness of between about 2 microns to about 12 microns, a thickness of about 5 microns to about 7 microns, or any sub-range therein or single thickness value therein. A total thickness of the protective coating stack in one embodiment is 300 μm or less. In certain embodiments, the protective coating provides full coating coverage to the underlying surface and is uniform in thickness. The uniform thickness of the coating across different sections of the coating may be evidenced by a variation in thickness that is about 15% or less, about 10% or less, or about 5% or less in one section of the coating as compared to another section of the coating.

The protective coatings 308, 310 are deposited ceramic layers that may be formed on the body 305 of the article 300 using an electron beam ion assisted deposition (EB-IAD) process. The EB-IAD deposited protective coatings 308, 310 may have a relatively low film stress (e.g., as compared to a film stress caused by plasma spraying or sputtering). The relatively low film stress may cause the lower surface of the body 305 to be very flat, with a curvature of less than about 50 microns over the entire body for a body with a 12 inch diameter.

The IAD deposited protective coatings 308, 310 has 0% porosity (i.e., no porosity) in embodiments. This low porosity may enable the chamber component to provide an effective vacuum seal during processing. Hermiticity measures the sealing capacity that can be achieved using the protective coating. A He leak rate of around less than 1E-9 ($cm^3/s$) can be achieved using the IAD deposited protective coating, according to an embodiment. In comparison, a He leak rate of around 1E-6 cubic centimeters per second ($cm^3/s$) can be achieved using alumina. Lower He leak rates indicate an improved seal. The hermiticity is measured by placing a coated coupon over O-ring of Helium test stand and pumping down the pressure until the gauge <E-9 torr/s (or <1.3E-9 cm$^3$/s), applying helium around the O-ring using a flow rate of helium of about 30 sccm by slowly moving the helium source around the O-ring and measuring the leak rate.

The IAD deposited protective coating has a dense structure, which can have performance benefits for application on a chamber lid for example. Additionally, the IAD deposited protective coating may have a low crack density and a high adhesion to the body 305, which can be beneficial for reducing cracks in the coating (both vertical and horizontal), delamination of the coating, yttrium-based particle generation by the coating, and yttrium-based particle defects on a wafer.

In certain embodiments, the protective coatings described herein do not exhibit any gaps, pin holes or uncoated areas. In certain embodiments, the number of cracks (vertical or horizontal) in a protective coating do not exceed three in a 4 k magnification image obtained using a scanning electron microscope (SEM) capable of resolution up to 20 k. In certain embodiments, there is no delamination of the coating and the adhesion of the coating is determined by measuring the amount of force used to separate the protective coating from the substrate and is determined in compliance with ASTM standards (G171-03(2009) e2, $C_{1624}$-05(2010), D7187-05). Adhesion strength of the protective coating to an aluminum substrate may be above 300 mN (milliNewton).

In certain embodiments, the roughness of the protective coating may be approximately unchanged from the starting roughness of the underlying substrate that is being coated. For instance, in certain embodiments, the starting roughness of the substrate may be about 8-16 micro-inches and the roughness of the coating may be approximately unchanged. In certain embodiments, the starting roughness of the underlying substrate may be lower than about 8 micro-inches, e.g. about 4 to about 8 micro-inches, and the roughness of the protective coating may be approximately unchanged. The protective coating may be polished to reduce a surface roughness to 8 micro-inches or below after deposition. The protective coating may be polished to reduce the surface roughness to from about 4 micro-inches to about 8 micro-inches.

In certain embodiments, the protective coating has a high hardness that may resist wear during plasma processing. The IAD deposited protective coating, according to an embodiment, has a hardness of about ≥7 GPa, e.g., about 8.6 GPa. The hardness of the coating is determined by nano-indentation in accordance with ASTM E2546-07.

An IAD deposited protective coating, according to an embodiment, has a breakdown voltage of greater than 1823 V per 5 μm coating. The breakdown voltage is determined in accordance with JIS C 2110.

The protective coatings described herein may have trace metals, such as, Ca (up to about 20 ppm), Cr (up to about 225 ppm), Cu (up to about 100 ppm), Fe (up to about 1000 ppm), Mg (up to about 20 ppm), Mn (up to about 20 ppm), Ni (up to about 200 ppm), K (up to about 20 ppm), Mo (up to about 2000 ppm), Na (up to about 40 ppm), Ti (up to about 50 ppm), Zn (up to about 20 ppm). Trace metal levels are determined using Laser Ablation Inductively Coupled Plasma Mass Spectrometry (LA ICPMS) at a depth of 2 μm. In certain embodiments, the coating has a purity of about 99.5% or more, about 99.6% or more, about 99.7% or more, about 99.8% or more, or about 99.9% or more, based on atom % or based on wt % of the protective coating.

Examples of other ceramics that may be used to form an adjacent protective coating in an embodiment where the adjacent protective coatings 308, 310 are composed of different ceramic materials, may include $Y_3Al_5O_{12}$, $Y_4Al_2O_9$, $Er_2O_3$, $Gd_2O_3$, $Er_3Al_5O_{12}$, $Al_2O_3$, $Gd_3Al_5O_{12}$, a ceramic compound comprising $Y_4Al_2O_9$ and a solid-solution of $Y_2O_3$—$ZrO_2$ ($Y_2O_3$—$ZrO_2$ solid solution), or any of the other ceramic materials previously identified.

Chamber components having IAD protective coatings may be used in applications that apply a wide range of temperatures. For example, chamber components with IAD protective coatings may be used in processes having temperatures at 0° C. to temperatures at 1000° C. The coated chamber components may be used at high temperatures (e.g., at or above 300° C.) without cracking caused by thermal shock.

Note that the composition of the protective coating described herein may be modified such that the material properties and characteristics identified above may vary by up to 30% in some embodiments. Accordingly, the described values for the protective coating properties should be understood as example achievable values. The protective coatings described herein should not be interpreted as being limited to the provided values.

Any chamber component in a processing chamber may be coated with the protective coating described herein, including but not limited to, a lid, a lid liner, a nozzle, a substrate support assembly, a gas distribution plate, a showerhead, an electrostatic chuck, a shadow frame, a substrate holding frame, a processing kit ring, a single ring, a chamber wall, a base, a liner kit, a shield, a plasma screen, a flow equalizer, a cooling base, a chamber viewport, or a chamber liner.

Figure 4A:
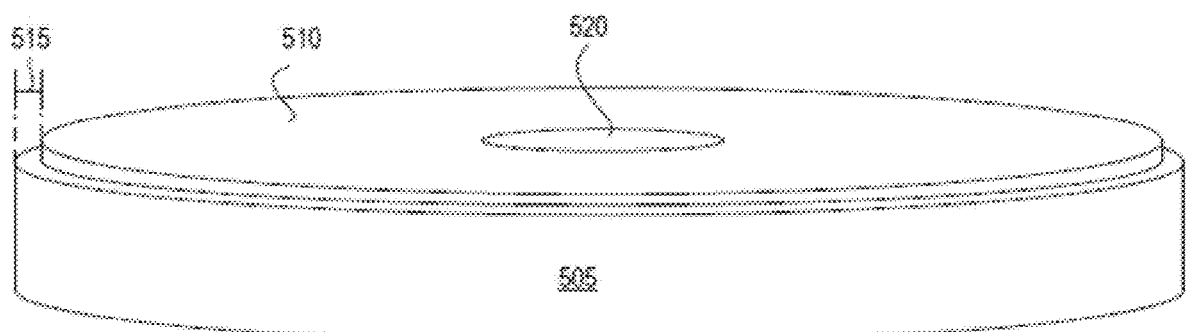
FIG. 4A illustrates a perspective view of a chamber lid having a protective coating, in accordance with one embodiment.
Figure 4B:
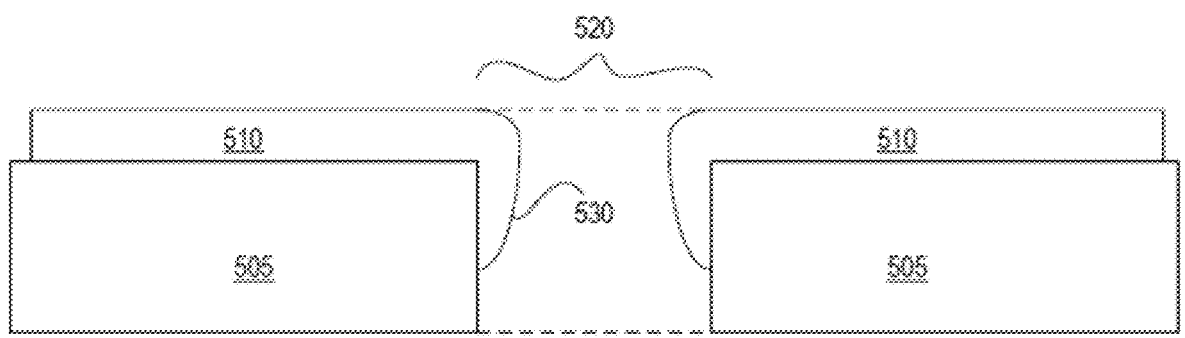
FIG. 4B illustrates a cross-sectional side view of a chamber lid having a protective coating, in accordance with one embodiment.

FIG. 4A illustrates a perspective view of a chamber lid 505 (similar to chamber lid 130 in FIG. 1) having a protective coating 510, in accordance with one embodiment. FIG. 4B illustrates a cross-sectional side view of a chamber lid 505 having a protective coating 510 (similar to coating 133 in FIG. 1), in accordance with one embodiment. The chamber lid 505 includes a hole 520, which may be at a center of the lid or elsewhere on the lid. The lid 505 may also have a lip 515 that will be in contact with walls of a chamber while the lid is closed. In one embodiment, the protective coating 510 does not cover the lip 515. To ensure that the protective coating does not cover the lip 515, a hard or soft mask may be used that covers the lip 515 during deposition. The mask may then be removed after deposition. Alternatively, the protective layer 510 may coat the entire surface of the lid. Accordingly, the protective layer 510 may rest on side walls of a chamber during processing.

As shown in FIG. 4B, the protective coating 510 may have a sidewall portion 530 that coats an interior of the hole 520. The sidewall portion 530 of the protective layer 510 may be thicker near a surface of the lid 505, and may gradually become thinner deeper into the hole 520. The sidewall portion 530 may not coat an entirety of the sidewalls of the hole 520 in such embodiments.

FIG. 5 illustrates one embodiment of a method 500 for coating an article, such as a chamber component, with a protective coating according to an embodiment. At block 505 of process 500, an article, such as a chamber component, is provided. The chamber component (e.g., lid) may have a bulk sintered ceramic body. The bulk sintered ceramic body may be $Al_2O_3$, $Y_2O_3$, $SiO_2$, or the ceramic compound comprising $Y_4Al_2O_9$ and a solid-solution of $Y_2O_3$—$ZrO_2$.

At block 510, an ion assisted deposition (IAD) process is performed to deposit a corrosion resistant and erosion resistant protective coating onto at least one surface of the chamber component. In one embodiment, an electron beam ion assisted deposition process (EB-IAD) is performed. The IAD process may be performed by melting a material that is to be deposited and bombarding the material with ions. While block 510 describes performing ion assisted deposition, such as e-beam IAD, to deposit a corrosion and erosion resistant protective coating as described herein, other deposition technique, such as physical vapor deposition and plasma spray deposition may also be utilized to deposit protective coatings described herein with a similar enhanced chemical resistance to aggressive chemical environment and physical resistance to aggressive plasma environment. An exemplary physical vapor deposition technique is described with respect to FIG. 11 in further detail below. An exemplary plasma spray deposition technique is described with respect to FIG. 12 in further detail below.

The erosion resistant and corrosion resistant protective coating may be a single phase (e.g., amorphous) blend of yttrium oxide at a molar concentration ranging from about 0.1 mole % to up to 37 mole % and aluminum oxide at a molar concentration ranging from above 63 mole % to about 99.9 mole %. In certain embodiments, the protective coating includes yttrium oxide at a molar concentration ranging from about 10 mole % to up to 37 mole % and aluminum oxide at a molar concentration ranging from above 63 mole % to about 90 mole %. In certain embodiments, the protective coating includes yttrium oxide at a molar concentration ranging from about 15 mole % to up to 37 mole % and aluminum oxide at a molar concentration ranging from above 63 mole % to about 85 mole %. In certain embodiments, the protective coating includes yttrium oxide at a molar concentration ranging from about 5 mole % to about 35 mole % and aluminum oxide at a molar concentration ranging from about 65 mole % to about 95 mole %. In certain embodiments, the protective coating includes yttrium oxide at a molar concentration ranging from about 5 mole % to about 30 mole % and aluminum oxide at a molar concentration ranging from about 70 mole % to about 95 mole %. In certain embodiments, the protective coating includes yttrium oxide at a molar concentration ranging from about 5 mole % to about 20 mole % and aluminum oxide at a molar concentration ranging from about 80 mole % to about 95 mole %.

A deposition rate for the protective coating may be about 0.02-20 Angstroms per second (A/s) in one embodiment, and may be varied by tuning deposition parameters. In one embodiment, a deposition rate of 0.25-1 A/s is initially used to achieve a conforming, well adhering coating on the substrate. A deposition rate of 2-10 A/s may then be used for depositing a remainder of a protective coating to achieve a thicker coating in a shorter time. The protective coatings may be very conforming, may be uniform in thickness, and may have a good adhesion to the body/substrate that they are deposited on.

With IAD processes, the energetic particles may be controlled by the energetic ion (or other particle) source independently of other deposition parameters. According to the energy (e.g., velocity), density and incident angle of the energetic ion flux, composition, structure, and crystalline/amorphous nature of the protective coating may be manipulated. Additional parameters that may be adjusted are a temperature of the article during deposition as well as the duration of the deposition.

The coating deposition rate can be controlled by adjusting an amount of heat that is applied by an electron beam. The ion assist energy may be used to densify the coating and to accelerate the deposition of material on the surface of the lid or nozzle. The ion assist energy can be modified by adjusting the voltage and/or the current of the ion source. The current and voltage can be adjusted to achieve high and low coating density, to manipulate the stress of the coating, and also to affect the amorphous nature of the coating. The ion assist energy can be used to manipulate the structure (e.g., crystalline/amorphous nature) of the protective coating and to change a stoichiometry of the protective layer. For example, a metallic target can be used, and during deposition metallic material converts to a metal oxide by the incorporation of oxygen ions at the surface of the lid or nozzle. Also, using an oxygen gun the level of any metal oxide coating can be changed and optimized to achieve desired coating properties.

Coating temperature can be controlled by using heaters (e.g., heat lamps) and by controlling the deposition rate. A higher deposition rate will typically cause the temperature of the chamber component to increase. The deposition temperature can be varied to control a film stress, crystallinity, and so on.

The working distance can be adjusted to modify uniformity, density and deposition rate. The deposition angle can be varied by the location of the electron beam gun or electron beam hearth, or by changing a location of the lid or nozzle in relation to the electron beam gun or electron beam hearth. By optimizing the deposition angle, a uniform coating in three dimensional geometries can be achieved.

FIG. 6 illustrates a method 600 for processing a wafer in a processing chamber that includes at least one chamber component coated with any of the protective coatings described herein. Method 600 includes transferring a wafer into a processing chamber that includes at least one chamber component (e.g., a lid, a liner, a door, a nozzle, and so on) coated with a protective coating (615). Method 600 further includes processing the wafer in the processing chamber at a harsh chemical environment and/or a high energy plasma environment (620). The processing environment may include halogen-containing gases and hydrogen-containing gases, such as $C_2F_6$, $SF_6$, $SiCl_4$, HBr, $NF_3$, $CF_4$, $CRF_3$, $CH_2F_3$, F, $NF_3$, $Cl_2$, $CCl_4$, $BCl_3$, $SiF_4$, $H_2$, $Cl_2$, HCl, HE, among others, and other gases such as $O_2$, or $N_{20}$. In one embodiment, the wafer may be processed in $Cl_2$. In one embodiments, the wafer may be processed in $H_2$. In one embodiment, the wafer may be processed in HBr. Method 600 further includes transferring the processed wafer out of the processing chamber (625).

Wafers processed according to methods described herein in processing chambers having at least one chamber component coated with a protective coating according to an embodiment exhibit a lower number of yttrium-based particle defects thereon. For instance, wafers processed according to method described herein exhibit, on average, less than about 5, less than about 4, less than about 3, less than about 2, less than about 1, less than about 0.5, or less than about 0.1 yttrium-based particle defects per wafer. Protective coatings described herein advantageously reduce defectivity on processed wafers.

FIG. 8 depicts a schematic illustrating the number of yttrium-based particle defects on wafers processed over 700 radio frequency hours (RFhr) under harsh chemical conditions, including exposure to aggressive $Cl_2$, $H_2$, and fluorine based chemistry. As depicted in FIG. 8, such chemistry results in early chamber part failure with traditional YO based coating materials, shown by data series 810 (e.g., as early as 50 RFhr). In comparison, with the protective coating composition described herein (shown as data series 820), no elevated yttrium based particles or yttrium based particle defects are observed and good performance is maintained over extended duration of 700 RFhr.

FIG. 9 depicts the reduced number in yttrium-based defects observed from chamber components coated with a protective coating according to an embodiment. As depicted in FIG. 9, upon exposure to aggressive chemistry, traditional YO based coating materials, shown by data series 830, result in yttrium-based particles ranging from above 5 up to about 25. In comparison, with the protective coating composition described herein (shown as data series 840), the number of yttrium based particles is close to zero.

FIGS. 10A through 10D depicts the enhanced chemical resistance of the protective coatings described herein as compared to other coatings deposited by the same deposition technique upon exposure of the various coatings to an acid stress test.

Figure 10A:
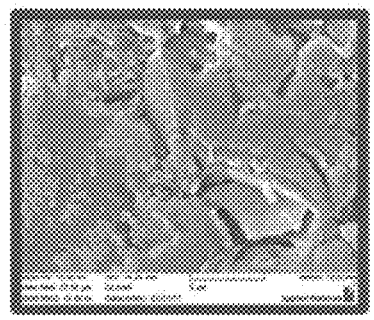
FIGS. 10A, 10B, 10C, and 10D show the chemical resistance of a protective coating according to an embodiment (FIG. 10D) as compared to a comparative YO coating (FIG. 10A), a comparative YAM coating (FIG. 10B), and a comparative YAG coating (FIG. 10C) upon the coatings' exposure to an acid stress test.

FIG. 10A depicts a YO coating deposited via e-beam IAD. As seen in FIG. 10A, upon exposure of the YO coating to an acid stress test, the YO coating exhibits heavy chemical damage.

Figure 10B:
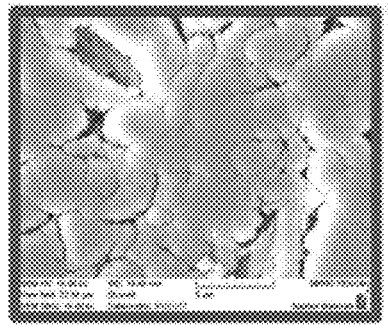

FIG. 10B depicts a YAM coating deposited via e-beam IAD. As seen in FIG. 10B, upon exposure of the YAM coating to an acid stress test, the YAM coating exhibits heavy chemical damage.

Figure 10C:
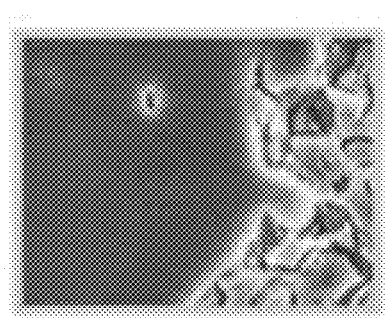

FIG. 10C depicts a YAG coating deposited via e-beam IAD. As seen in FIG. 10C, upon exposure of the YAG coating to an acid stress test, the YAG coating exhibits mild chemical damage.

Figure 10D:
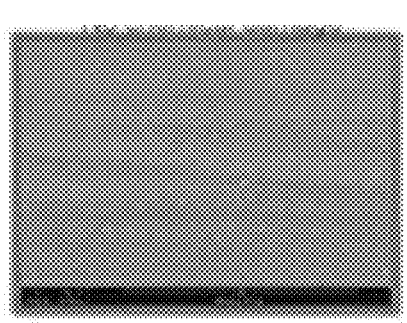

FIG. 10D depicts a coating according to embodiments described herein deposited via e-beam IAD. As seen in FIG. 10D, upon exposure of a coating according to embodiments described herein to an acid stress test, the coating exhibits no chemical damage.

Without being construed as limiting, it can be appreciated from FIGS. 10A to 10D, that with increasing aluminum/alumina concentration in the coating composition, the chemical resistance of the coating (as determined based on an acid stress test) improved.

As previously indicated, any of the protective coatings described herein may also be deposited by other techniques, such as PVD or plasma spray. These techniques are described in further detail below with respect to FIGS. 11 and 12 respectively.

PVD processes may be used to deposit thin films with thicknesses ranging from a few nanometers to several micrometers. The various PVD processes share three fundamental features in common: (1) evaporating the material from a solid source with the assistance of high temperature or gaseous plasma; (2) transporting the vaporized material in vacuum to the article's surface; and (3) condensing the vaporized material onto the article to generate a thin film layer. An illustrative PVD reactor is depicted in FIG. 11.

Figure 11:
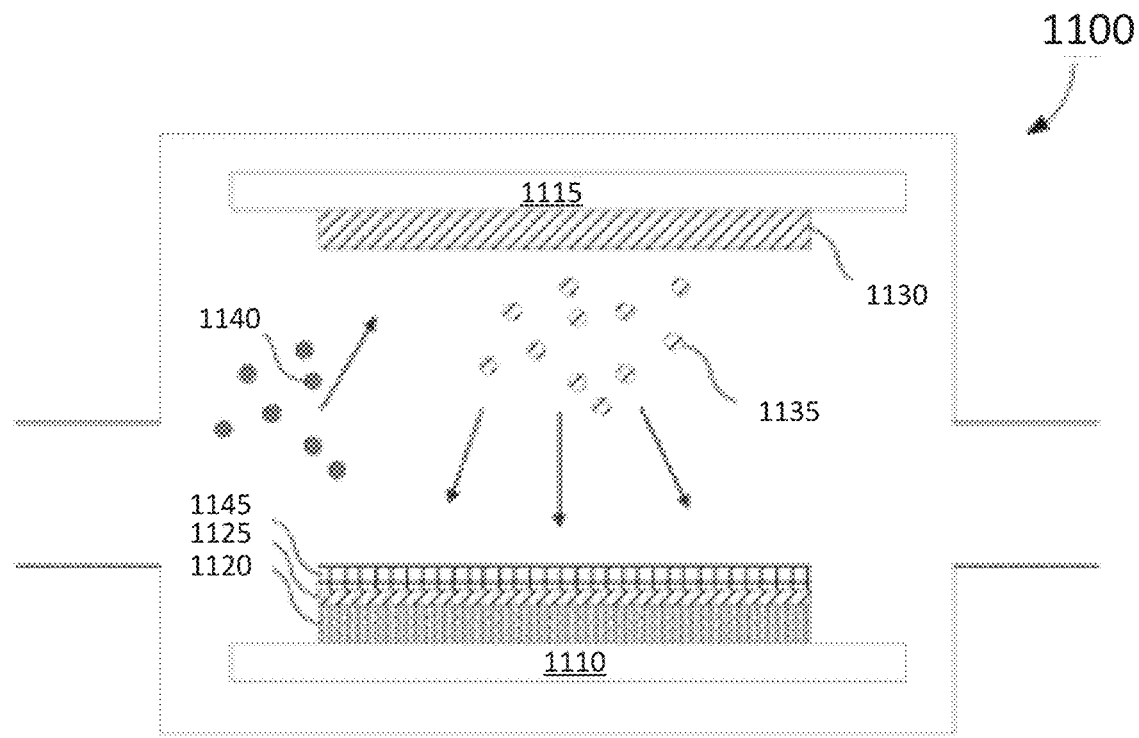
FIG. 11 depicts a schematic of a physical vapor deposition technique that may be utilized to deposit a protective coating according to an embodiment.

FIG. 11 depicts a deposition mechanism applicable to a variety of PVD techniques and reactors. PVD reactor chamber 1100 may comprise a plate 1110 adjacent to the article 1120 and a plate 1115 adjacent to the target 1130. In certain embodiments, a plurality of targets (e.g., two targets) may be used. Air may be removed from reactor chamber 1100, creating a vacuum. Then gas (such as argon gas or oxygen gas) may be introduced into the reactor chamber, voltage may be applied to the plates, and a plasma comprising electrons and positive ions (such as argon ions or oxygen ions) 1140 may be generated. Ions 1140 may be positive ions and may be attracted to negatively charged plate 1115 where they may hit one or more target(s) 1130 and release atoms 1135 from the target. Released atoms 1135 may get transported and deposited as a coating 1125 onto article 1120. The coating may have a single layer architecture or may include a multi-layer architecture (e.g., layers 1125 and 1145).

Article 1120 in FIG. 11 may represent various semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on.

Coating 1125 (and optionally 1145) in FIG. 11 may represent any of the protective coatings described herein. Coating 1125 (and optionally 1145) can have the same composition of aluminum/alumina, yttria/yttrium, and oxygen as the coatings previously described. Similarly, Coating 1125 (and optionally 1145) can have any of the properties described hereinbefore, such as, without limitations, percent amorphous, porosity, adhesion strength, chemical resistance, physical resistance, hardness, purity, breakdown voltage, hermeticity, and so on. Furthermore, coating 1125 (and optionally 1145) can exhibit similar reduced defectivity (as estimated based on yttrium-based particle defects per wafer) upon exposure to aggressive chemical environment and/or to aggressive plasma environment over extended duration (e.g., 700 RFhrs).

Figure 12:
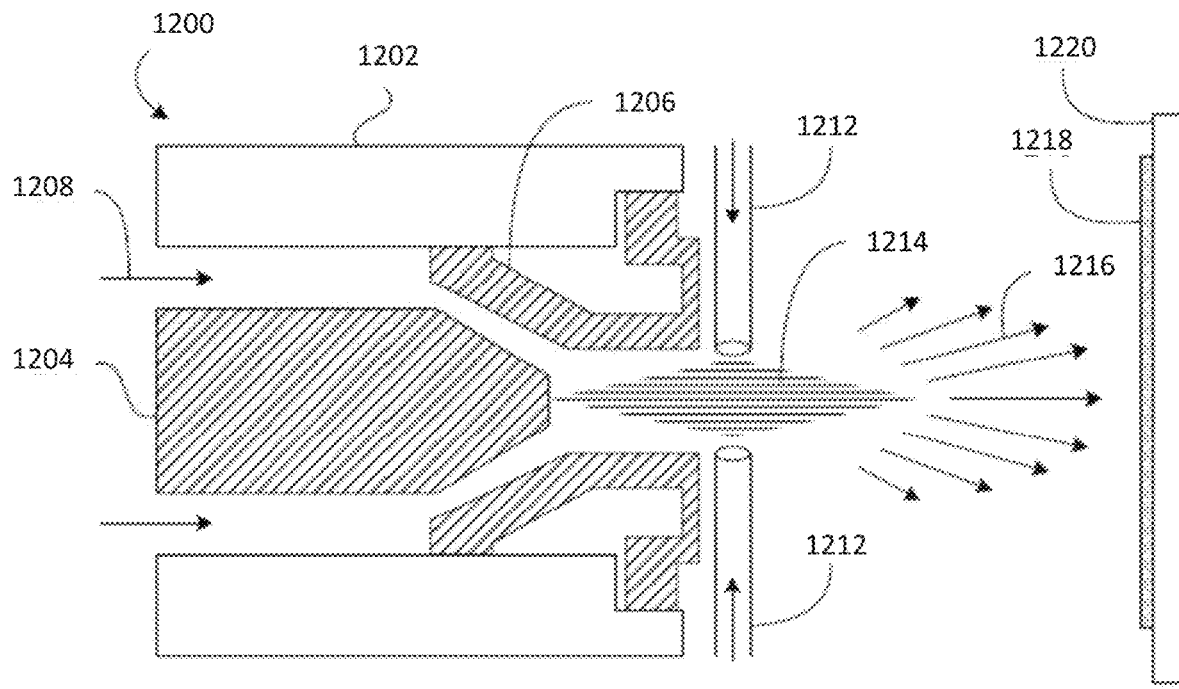
FIG. 12 depicts a schematic of a plasma spray deposition technique that may be utilized to deposit a protective coating according to an embodiment.

FIG. 12 depicts a sectional view of a plasma spray device 1200 according to an embodiment. The plasma spray device 1200 is a type of thermal spray system that is used to perform "slurry plasma spray" ("SPS") deposition of ceramic materials. While the description below will be described with respect to the SPS technique, other standard plasma spray techniques may also be utilized to deposit the coatings described herein.

SPS deposition utilizes a solution-based distribution of particles (a slurry) to deposit a ceramic coating on a substrate. The SPS may be performed by spraying the slurry using atmospheric pressure plasma spray (APPS), high velocity oxy-fuel (HVOF), warm spraying, vacuum plasma spraying (VPS), and low pressure plasma spraying (LPPS).

The plasma spray device 1200 may include a casing 1202 that encases a nozzle anode 1206 and a cathode 1204. The casing 1202 permits gas flow 1208 through the plasma spray device 1200 and between the nozzle anode 1206 and the cathode 1204. An external power source may be used to apply a voltage potential between the nozzle anode 1206 and the cathode 1204. The voltage potential produces an arc between the nozzle anode 1206 and the cathode 1204 that ignites the gas flow 1208 to produce a plasma gas. The ignited plasma gas flow 1208 produces a high-velocity plasma plume 1214 that is directed out of the nozzle anode 1206 and toward a substrate 1220.

The plasma spray device 1200 may be located in a chamber or atmospheric booth. In some embodiments, the gas flow 1208 may be a gas or gas mixture including, but not limited to, argon, oxygen, nitrogen, hydrogen, helium, and combinations thereof. In certain embodiments, other gases, such as fluorine, may be introduced to incorporate some fluorine into the coating so that it is more resistant to wear in a fluorine processing environment.

The plasma spray device 1200 may be equipped with one or more fluid lines 1212 to deliver a slurry into the plasma plume 1214. In some embodiments, several fluid lines 1212 may be arranged on one side or symmetrically around the plasma plume 1214. In some embodiments, the fluid lines 1212 may be arranged in a perpendicular fashion to the plasma plume 1214 direction, as depicted in FIG. 12. In other embodiments, the fluid lines 1212 may be adjusted to deliver the slurry into the plasma plume at a different angle (e.g., 45°), or may be located at least partially inside of the casing 1202 to internally inject the slurry into the plasma plume 1214. In some embodiments, each fluid line 1212 may provide a different slurry, which may be utilized to vary a composition of a resulting coating across the substrate 1220.

A slurry feeder system may be utilized to deliver the slurry to the fluid lines 1212. In some embodiments, the slurry feeder system includes a flow controller that maintains a constant flow rate during coating. The fluid lines 1212 may be cleaned before and after the coating process using, for example, de-ionized water. In some embodiments, a slurry container, which contains the slurry fed to the plasma spray device 1200, is mechanically agitated during the course of the coating process keep the slurry uniform and prevent settling.

Alternatively, in standard powder based plasma spray techniques, a powder delivery system, that includes one or more powder containers filled with one or more different powders, may be used to deliver powder into the plasma plume 1214 (not shown).

The plasma plume 1214 can reach very high temperatures (e.g., between about 3000° C. to about 10000° C.). The intense temperature experienced by the slurry (or slurries) when injected into the plasma plume 1214 may cause the slurry solvent to evaporate quickly and may melt the ceramic particles, generating a particle stream 1216 that is propelled toward the substrate 1220. In a standard powder based plasma spray technique, the intense temperature of the plasma plume 1214 also melts the powder delivered thereto and propels the molten particles toward the substrate 1220. Upon impact with the substrate 1220, the molten particles may flatten and rapidly solidify on the substrate, forming a ceramic coating 1218. The solvent may be completely evaporated prior to the ceramic particles reaching the substrate 1220.

Protective coatings deposited using plasma spray deposition may, in certain embodiments, have a greater porosity than that of coatings deposited by e-beam IAD. For instance, in certain embodiments, plasma spray deposited protective coatings may have a porosity of up to about 10%, up to about 8%, up to about 6%, up to about 4%, up to about 3%, up to about 2%, up to about 1%, or up to about 0.5%.

The parameters that can affect the thickness, density, and roughness of the ceramic coating include the slurry conditions, the particle size distribution, the slurry feed rate, the plasma gas composition, the gas flow rate, the energy input, the spray distance, and substrate cooling.

Article 1220 in FIG. 12 may represent various semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on.

Coating 1218 in FIG. 12 may represent any of the protective coatings described herein. Coating 1218 can have the same composition of aluminum/alumina, yttria/yttrium, and oxygen as the coatings previously described. Similarly, Coating 1218 can have any of the properties described hereinbefore, such as, without limitations, percent amorphous, porosity, adhesion strength, chemical resistance, physical resistance, hardness, purity, breakdown voltage, hermeticity, and so on. Furthermore, Coating 1218 can exhibit similar reduced defectivity (as estimated based on yttrium-based particle defects per wafer) upon exposure to aggressive chemical environment and/or to aggressive plasma environment over extended duration (e.g., 700 RFhrs).

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of coating a chamber component, comprising:
performing electron beam ion assisted deposition (e-beam IAD), or physical vapor deposition (PVD) to deposit a protective coating on a chamber component,
wherein the protective coating is amorphous and comprises a single phase blend of yttrium oxide at a molar concentration ranging from 12 mole % up to 20 mole % and aluminum oxide at a molar concentration ranging from 80 mole % to 88 mole %.

2. The method of claim 1, wherein the protective coating comprises yttrium oxide at a molar concentration ranging from 12 mole % up to 19 mole % and aluminum oxide at a molar concentration ranging from 80 mole % to 87 mole %.

3. The method of claim 1, wherein the protective coating comprises yttrium oxide at a molar concentration ranging from 14 mole % to 20 mole % and aluminum oxide at a molar concentration ranging from 80 mole % to 85 mole %.

4. The method of claim 1, wherein the chamber component comprises a lid, a lid liner, a nozzle, a substrate support assembly, a gas distribution plate, a showerhead, an electrostatic chuck, a shadow frame, a substrate holding frame, a processing kit ring, a single ring, a chamber wall, a base, a liner kit, a shield, a plasma screen, a flow equalizer, a cooling base, a chamber viewport, or a chamber liner.

5. The method of claim 1, wherein the protective coating is chemically resistant to corrosive chemistry and is physically resistant to high energy plasma, and wherein the corrosive chemistry comprises hydrogen-based chemistry, halogen-based chemistry, or a mixture thereof.

6. The method of claim 1, wherein the protective coating has uniform thickness with a thickness variation of 15% or less in one section of the protective coating as compared to another section.

7. The method of claim 6, wherein the protective coating is uniform as evidence by a variation of thickness that is 5% or less in one section of the protective coating as compared to another section of the protective coating.

8. The method of claim 1, wherein the protective coating is pinhole free.

9. The method of claim 1, wherein the protective coating has a thickness of below 300 microns.

10. The method of claim 1, wherein the protective coating has a thickness of below 20 microns.

11. The method of claim 1, wherein the protective coating has a roughness ranging from 4 micro-inches to 16 micro-inches.

12. The method of claim 1, wherein the protective coating has a purity of 99.5 wt % or more.

13. The method of claim 1, wherein e-beam IAD is performed in presence of oxygen, argon, or fluorine.

14. The method of claim 1, wherein the protective coating is deposited at a deposition rate of about 0.02-20 Angstroms per second.

* * * * *